(12) United States Patent
Gerritsen et al.

(10) Patent No.: US 6,812,121 B2
(45) Date of Patent: Nov. 2, 2004

(54) PROCESS FOR FORMING A LOW RESISTIVITY TITANIUM SILICIDE LAYER ON A SILICON SEMICONDUCTOR SUBSTRATE

(75) Inventors: Eric Gerritsen, Crolles (FR); Bruno Baylac, Brignoud (FR); Marie-Thérèse Basso, Meylan (FR)

(73) Assignees: STMicroelectronics S.A., Montrouge (FR); Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/858,400

(22) Filed: May 16, 2001

(65) Prior Publication Data

US 2003/0207569 A1 Nov. 6, 2003

Related U.S. Application Data

(62) Division of application No. 09/267,308, filed on Mar. 12, 1999, now Pat. No. 6,281,556.

(30) Foreign Application Priority Data

Mar. 13, 1998 (FR) .............................................. 98 03134

(51) Int. Cl.[7] .................. H01L 21/3205; H01L 21/4763
(52) U.S. Cl. ...................... 438/592; 438/301; 438/303; 438/581; 438/583; 438/664
(58) Field of Search ................................ 438/592, 301, 438/306–307, 581, 583, 663–664, 655, 651, 649

(56) References Cited

U.S. PATENT DOCUMENTS

| | | | |
|---|---|---|---|
| 4,821,085 A | | 4/1989 | Haken et al. |
| 4,849,802 A | | 7/1989 | Jackson et al. |
| 5,545,574 A | | 8/1996 | Chen et al. |
| 5,602,045 A | * | 2/1997 | Kimura ...................... 438/305 |
| 5,633,202 A | * | 5/1997 | Brigham et al. ............. 438/763 |
| 5,659,194 A | | 8/1997 | Iwamatsu et al. |
| 5,985,727 A | * | 11/1999 | Burr ........................... 438/302 |
| 6,010,952 A | * | 1/2000 | Tsai et al. ................... 438/528 |
| 6,146,934 A | * | 11/2000 | Gardner et al. ............. 438/230 |
| 6,255,702 B1 | * | 7/2001 | Iwata et al. ................. 257/412 |
| 6,297,114 B1 | * | 10/2001 | Iwata et al. ................. 438/305 |

FOREIGN PATENT DOCUMENTS

| | | |
|---|---|---|
| EP | 0 746 012 A2 | 12/1996 |
| EP | 0123456 A2 | 1/2000 |

OTHER PUBLICATIONS

European Patent Abstract of Japanese Publication No. 05218069, published on Aug. 27, 1993.
"Advances in the formation of C54–TiSl2 with an interposed refractory metal layer: some properties", Microelectronic Engineering, vol. 37–38, Nov. 1997, pp. 449–454.
"Resistivity and morphology of TlSl2 formed on Xe+ Implanted polycrystalline silicon", Applied Physics Letters, vol. 56, No. 5 Jan. 12, 1990, pp. 440–442.
European Search Report dated Dec. 3, 1998 with annex on French Application No. 9803134.

* cited by examiner

Primary Examiner—Thanh Nguyen
(74) Attorney, Agent, or Firm—Lisa K. Jorgenson; Stephen Bongini; Fleit, Kain, Gibbons, Gutman, Bongini & Bianco P.L.

(57) ABSTRACT

A process for forming a low resistivity titanium silicide layer on the surface of a silicon semiconductor substrate. In the process, an effective amount of a metallic element such as indium, gallium, tin, or lead is implanted or deposited on the surface of the silicon substrate. A titanium layer is deposited on the surface of the silicon substrate, and a rapid thermal annealing of the titanium-coated silicon substrate is performed to form low resistivity titanium silicide. In preferred processes, the metallic element is indium or gallium, and more preferably the metallic element is indium. A semiconductor device that has a titanium silicide layer on the surface of a silicon substrate is also provided.

31 Claims, 8 Drawing Sheets

PROCESS FOR FORMING A LOW RESISTIVITY TITANIUM SILICIDE LAYER ON A SILICON SEMICONDUCTOR SUBSTRATE

This is a divisional of application Ser. No. 09/267,308, filed Mar. 12, 1999, now U.S. Pat. No. 6,281,556. The entire disclosure of prior application Serial No. 09/267,308 is herein incorporated by reference.

CROSS-REFERENCE TO RELATED APPLICATIONS

This application is based upon and claims priority from prior French Patent Application No. 98-03134, filed Mar. 13, 1998, the entire disclosure of which is herein incorporated by reference.

BACKGROUND OF THE INVENTION

1. Field of the Invention

The present invention relates to the fabrication of semiconductor devices, and more specifically to a process for forming a low resistivity titanium silicide layer at the surface of doped areas of a silicon semiconductor substrate.

2. Description of Related Art

Titanium silicide is the predominant silicide used in the integrated microelectronic device industry, in particular in VLSI and ULSI technologies. Titanium silicide $TiSi_2$ is a polymorphic material that can exist in a base-centered orthorhombic form, which is known as the C49 phase, or in a face-centered orthorhombic form, which is known as the C54 phase. Titanium silicide has a high resistivity of about 75 $\mu$ohm.cm in the C49 phase, and a low resistivity of about 15 $\mu$ohm.cm in the C54 phase. When a titanium film is deposited on silicon and heated, the high resistivity C49 phase is first formed at temperatures between 550° C. and 700° C., and is then transformed into the low resistivity C54 phase at temperatures above approximately 750° C. The transformation of the titanium silicide film from the C49 phase into the C54 phase is limited by a high activation energy (greater than 5.0 eV) that depends on the dopants, on the crystallinity of the silicon substrate, and on the size of the region to be silicided.

Experimentally, the high activation energy required to form the C54 phase results in a very low density of C54 nuclei being formed in a matrix of C49 phase during thermal annealing. With the current reduction in line widths (e.g., to 0.3 $\mu$m or less), it is becoming increasingly difficult to use thermal annealing to transform a structure from the high resistivity C49 phase into the low resistivity C54 phase because of a lack of C54 nuclei. As a result, the titanium silicide $TiSi_2$ films are either still in the form of the C49 phase or are composed of a mixture of the C49 and C54 phases. Thus, the film has a higher resistivity than would be obtained with a complete transformation to the C54 phase, and the high resistivity of the titanium silicide can decrease the performance of the semiconductor device (e.g., CMOS device) being produced.

To overcome this problem, it has been proposed to implant or deposit atoms of a refractory metal such as molybdenum or tungsten at the surface of the silicon substrate before depositing the titanium layer and forming the titanium silicide through rapid thermal annealing. It has also been proposed to use other refractory metals such as tantalum and niobium. An article entitled "Reduction of the C54-$TiSi_2$ phase transformation temperature using refractory metal ion implantation" by R. W. Mann et al. (Appl. Phys. Lett. 67(25), Dec. 18, 1995) discloses forming titanium silicide having a low resistivity by implanting ions of a refractory metal such as tungsten or molybdenum on a silicon substrate, depositing a thin layer of titanium, and then performing a rapid thermal treatment.

Additionally, an article entitled "$TiSi_2$ phase transformation characteristics on narrow devices" by Glen L. Miles et al. (Thin Solid Films 290–291 (1996), 469–472) indicates that the presence of small quantities of molybdenum during silicide formation increases the level of C54 phase precursor nuclei. The article states that the molybdenum can act as a catalyst and that there does not have to be a mixture at the interface or the creation of an amorphous silicon layer in order to improve nucleation. The use of molybdenum to promote titanium silicide transformation from the C49 phase to the C54 phase is also described in an article entitled "Salicides for 0.10 $\mu$m gate lengths: A comparative study of one-step RTP Ti with Mo doping, Ti with pre-amorphization and Co processes" by Jorge A. Kittl et al. (1997 Symposium on VLSI Technology Digest of Technical Papers) and another article entitled "Novel one-step RTP Ti silicide process with low-sheet-resistance 0.06 $\mu$m gates and high drive current" by Jorge A. Kittl et al. (IEDM 97, 111 to 114).

Although doping using refractory metals such as molybdenum and tungsten improves titanium silicide transformation from the C49 phase to the C54 phase, the use of refractory metals such as molybdenum and tungsten has drawbacks. First, molybdenum and tungsten form very stable compounds with silicon, and this is detrimental to titanium silicide formation. Additionally, molybdenum or tungsten implantation is undesirable because of problems with cross-contamination of the implanted element.

Further, an article entitled "Sub-quarter micron titanium silicide technology with in-situ silicidation using high-temperature sputtering" by Kuinihiro Fujii et al. (1995 Symposium on VLSI Technology Digest of Technical Papers) discloses the pre-amorphization of the surface of a silicon substrate by arsenic implantation for the purpose of promoting titanium silicide transformation from the C49 phase to the C54 phase. However, the disclosed process gives rise to leakage at junctions, mainly in NMOS devices. Additionally, the effect on the resistivity of the titanium silicide is relatively modest.

SUMMARY OF THE INVENTION

In view of these drawbacks, it is an object of the present invention to remove the above-mentioned drawbacks and to provide a process for forming a low resistivity titanium silicide layer on the surface of at least one doped area of a silicon semiconductor substrate. In the process, a titanium layer is deposited on the surface of at least one doped area of the substrate, and rapid thermal annealing of the titanium-coated substrate is performed in order to form titanium silicide. Further, before performing the thermal annealing, an effective amount of a metallic element such as indium (In), gallium (Ga), tin (Sn), or lead (Pb) is implanted or deposited at the interface between the titanium layer and said at least one doped area of the silicon semiconductor substrate. Preferably, the metallic element is indium or gallium, and more preferably the metallic element is indium.

In the process of the present invention, the effective amount of the metallic element is an amount sufficient to promote titanium silicide transformation from the C49 phase to the C54 phase during the subsequent rapid thermal annealing. In preferred processes, the effective amount of the metallic element is between $1\times10^{13}$ and $5\times10^{14}$ atoms/$cm^2$, more preferably between $5\times10^{13}$ and $5\times10^{14}$ atoms/$cm^2$, and even more preferably between $5\times10^{13}$ and $3\times10^{14}$ atoms/$cm^2$. The metallic element can be introduced at the interface between the doped area of the silicon substrate and the titanium layer through implantation of the metallic element into the doped area of the silicon substrate or through deposition on the surface of the doped area of the silicon substrate before the titanium layer is deposited. Alternatively, the metallic element may be introduced, after the titanium layer has been deposited, by diffusion or by implantation through the titanium layer. Further, the metallic element can simply be incorporated into the alloy of the target used for depositing the titanium layer by sputtering.

In preferred processes, the metallic element is implanted into the silicon substrate before the titanium layer is deposited, with the implantation depth of the metallic element being generally between 5 and 25 nm, and preferably between 8 and 20 nm. Any conventional implantation process can be used for the metallic element implantation, and preferably conventional ion beam implantation is used. The implantation energy of the metallic element is generally between 5 and 30 keV, and preferably is approximately 25 keV. In this manner, it is possible to implant a dose of $3\times10^{14}$ In/$cm^2$ from a solid $InCl_3$ target-source heated to 320° C. with a 25 keV implantation energy.

Deposition of the titanium layer can be performed by any conventional deposition process, such as physical vapor deposition (PVD). For example, it is possible to deposit a 30 nm titanium layer by PVD in approximately 15 seconds. Further, the thermal annealing for forming the titanium silicide can be performed by any conventional annealing process such as annealing at 760° C. for 20 seconds.

Another object of the present invention is to provide a semiconductor device that has a titanium silicide layer on the surface of at least one doped area of a silicon substrate. At the interface between the titanium silicide and the doped area of the substrate, there is provided between 0.5 and 5‰ atoms of a metallic element such as indium, gallium, tin, or lead. Preferably, the metallic element is indium or gallium, and more preferably the metallic element is indium. Also, preferably, the doped areas of the substrate are source and drain regions of a CMOS device.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

General Description

Figure 1A:
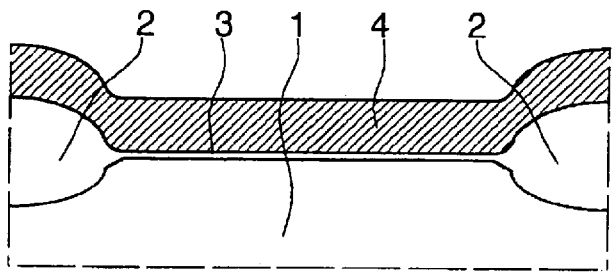
FIGS. 1a through 1e are diagrams showing relevant steps of a process for fabricating a semiconductor device having a low resistivity titanium silicide layer in accordance with a preferred embodiment of the present invention.

A process for fabricating an NMOS or PMOS device having a low resistivity titanium silicide layer in accordance with a preferred embodiment of the present invention will now be described with reference to FIGS. 1a through 1e. First, as shown in FIG. 1a, insulating regions 2 formed of thick silicon oxide layers and gate oxide regions 3 are formed on the surface of a silicon substrate 1, and a polycrystalline silicon layer 4 is deposited over the insulating and gate oxide regions (e.g., through low pressure vapor deposition).

Figure 1B:
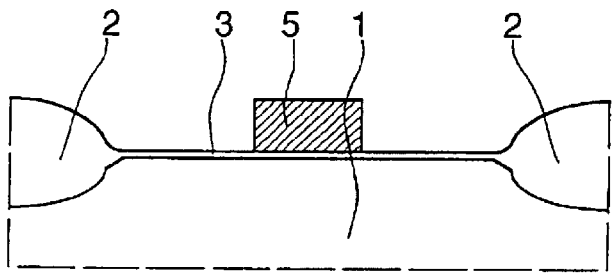
Figure 1C:
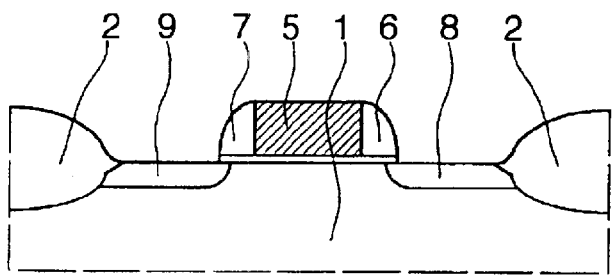

Next, photolithographic etching is used to form a polycrystalline silicon gate 5 from the polycrystalline silicon layer 4, as shown in FIG. 1b. For an NMOS device, a doping operation can also be performed by implanting phosphorus atoms in order to reduce the depletion of the polycrystalline silicon gate. Then, spacers 6 and 7 are formed, and arsenic or boron is implanted to form n-type or p-type source and drain regions 8 and 9, as shown in FIG. 1c. (The steps described above with reference to FIGS. 1a through 1c are well known conventional steps used to fabricate semiconductor devices.)

Figure 1D:
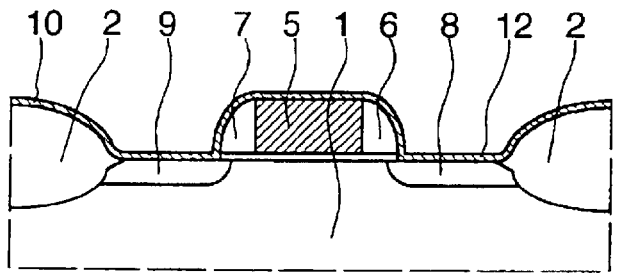

In accordance with the device fabrication process of the preferred embodiment of the present invention, indium atoms are next implanted before a titanium layer 10 is deposited (FIG. 1d). Preferably, the indium implantation is performed at approximately ambient temperature using an ion beam with a 25 keV implantation energy. Further, the implanted dose is preferably $3\times10^{14}$ atoms/$cm^2$. After the indium implantation, the titanium layer is deposited to an illustrative thickness of 30 nm using conventional physical vapor deposition optionally followed by conventional TiN deposition.

Figure 1E:
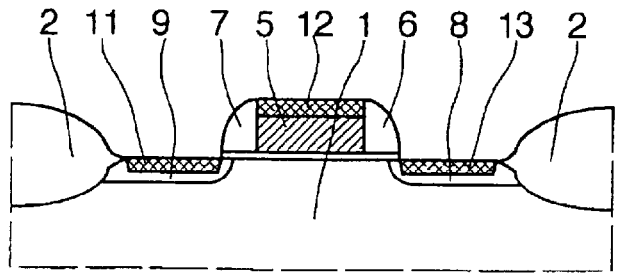

Then, in device fabrication process of the preferred embodiment, a conventional rapid thermal annealing operation is performed to form low resistivity (i.e., C54 phase) titanium silicide contacts 11, 12, and 13, as shown in FIG. 1e. Any Ti and TiN that has not reacted is then removed through selective etching in a conventional manner. While the rapid thermal annealing operation can be conventional annealing at 760° C. for a period of 20 seconds under nitrogen, it has been found (as described below) that low resistivity titanium silicide can be formed at lower annealing temperatures by using the process of the present invention to introduce indium at the interface between the titanium layer and the substrate.

EXAMPLE 1 AND COMPARATIVE EXAMPLES A THROUGH E

An NMOS device with a 0.25 μm channel was fabricated using the process described above without predoping with phosphorus. The NMOS device of Example 1 had undergone indium implantation to a level of $3\times10^{14}$ atoms/cm$^2$ with a 25 keV implantation energy. The comparative NMOS device E is a standard NMOS device (i.e., one fabricated without implantation before deposition of the titanium layer). The comparative NMOS devices A through D were fabricated according to conventional processes in which arsenic implantation is performed before deposition of the titanium layer and formation of the titanium silicide. The implanted doses of arsenic and the implantation energies for the comparative devices A through D are as follows.

Comparative Example A: $1\times10^{14}$ atoms/cm$^2$ at 10 keV
Comparative Example B: $1\times10^{14}$ atoms/cm$^2$ at 20 keV
Comparative Example C: $3\times10^{14}$ atoms/cm$^2$ at 10 keV
Comparative Example D: $3\times10^{14}$ atoms/cm$^2$ at 20 keV.

Figure 2:
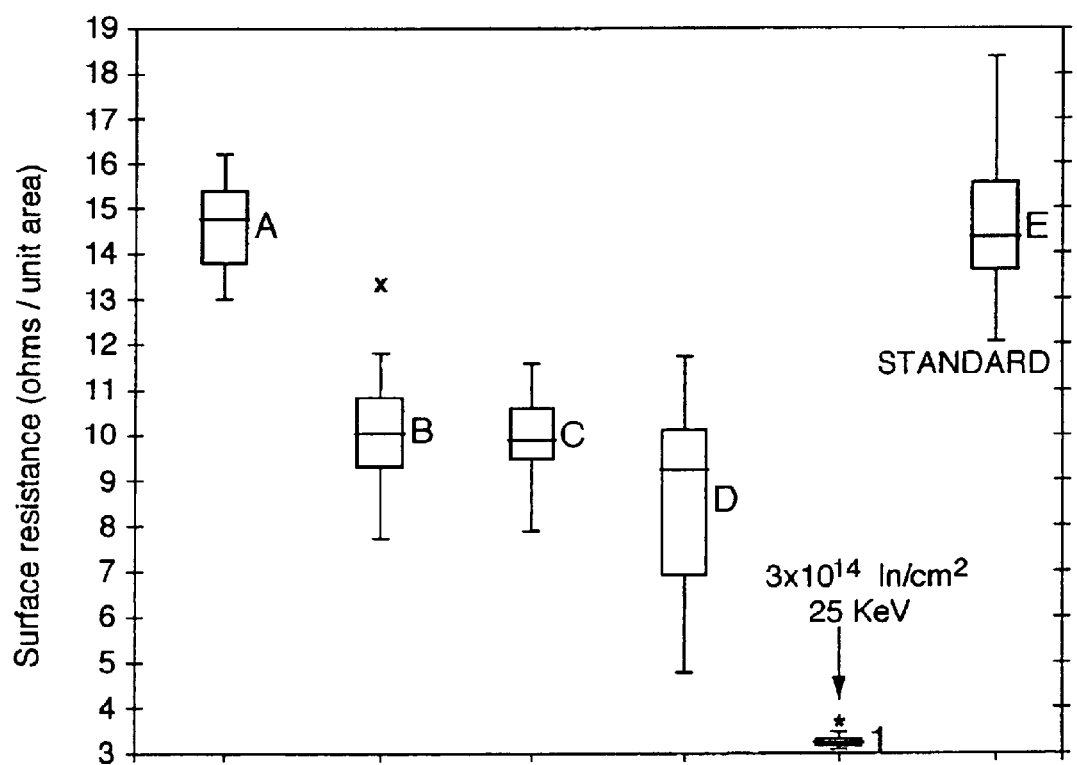
FIG. 2 is a graph comparing the surface resistance of an NMOS device fabricated using the process of the present invention with NMOS devices fabricated using conventional processes without implantation and with arsenic ion implantation.
Figure 3:
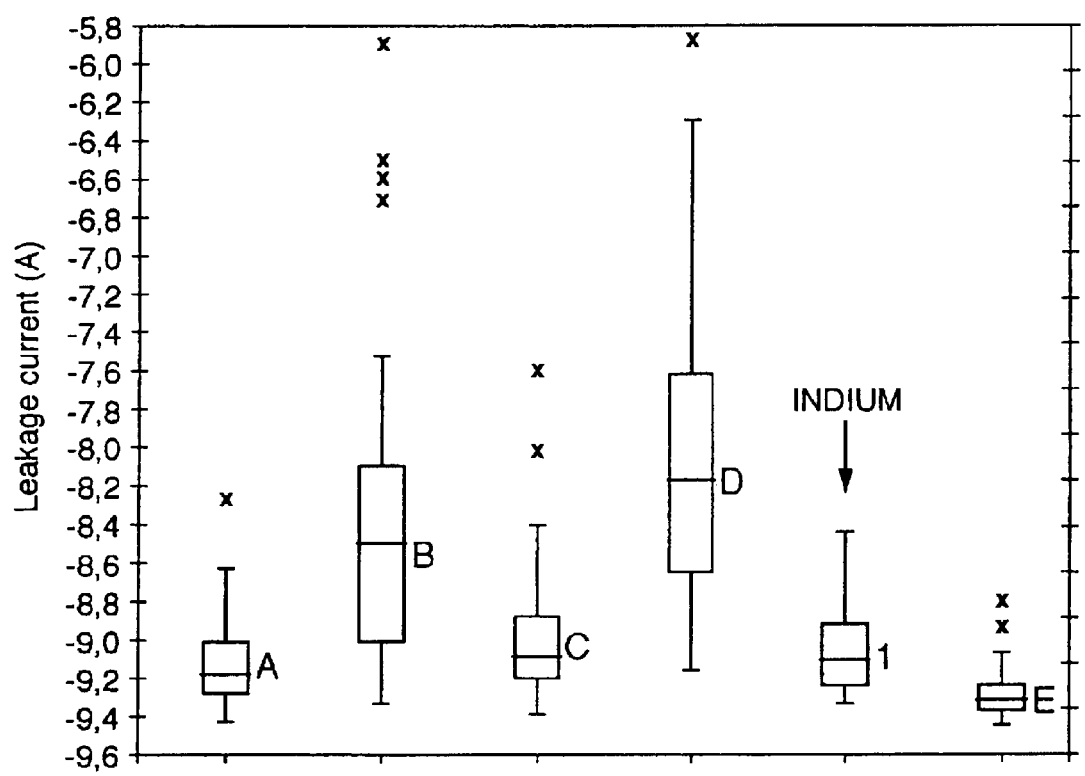
FIG. 3 is a graph comparing the junction leakage current in an NMOS device fabricated using the process of the present invention with conventional NMOS devices that have undergone arsenic ion implantation.

FIG. 2 shows the surface resistances for all of these devices. It is immediately apparent that the NMOS device fabricated using the process of the present invention has a markedly lower surface resistance than the devices fabricated using conventional processes. FIG. 3 shows the leakage currents for all of these devices. As shown, the device of Example 1 fabricated in accordance with the present invention has no leakage current.

EXAMPLE 2 AND COMPARATIVE EXAMPLES F THROUGH J

PMOS devices were fabricated in the manner indicated above with respect to the NMOS devices, but by replacing the arsenic with boron so as to form p-conductivity source and drain regions. The subsequent implantations of arsenic atoms in the cases of Comparative Examples F through I respectively correspond to the implantations performed above for the previous Comparative Examples A through D. Likewise, Comparative Example J is a standard PMOS device that was formed without any implantation.

Figure 4:
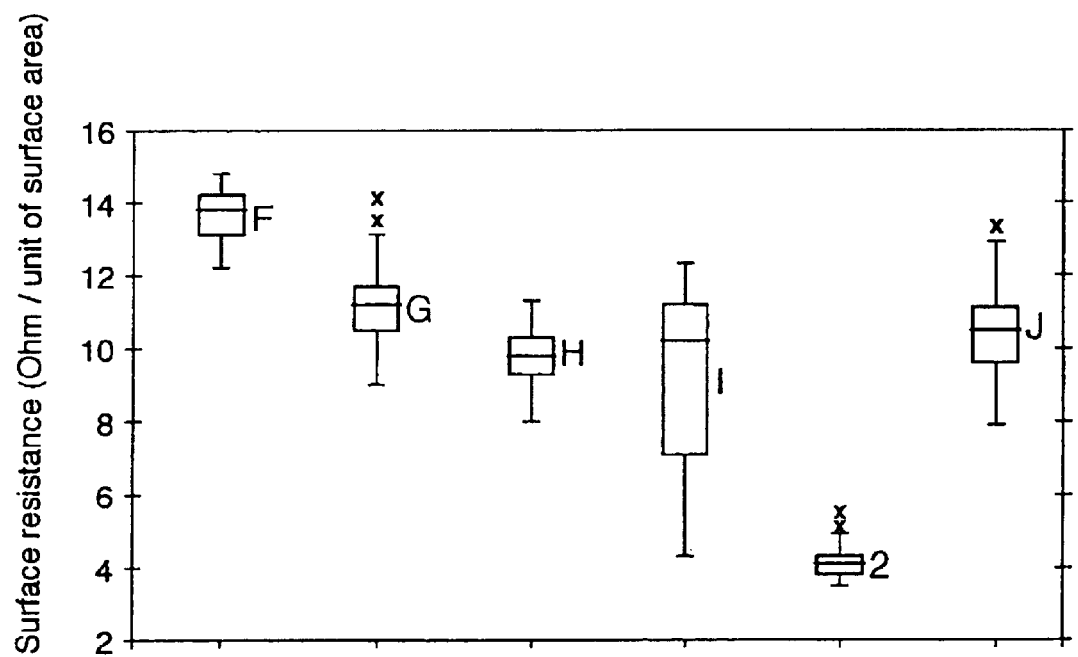
FIG. 4 is a graph comparing the surface resistance of a PMOS device fabricated using the process of the present invention with conventional PMOS devices that have undergone arsenic implantation.

FIG. 4 shows the surface resistances for all of these devices. It can be seen that the PMOS device of Example 2 has a markedly lower surface resistance than the devices of Comparative Examples F through J. While in all known siliciding processes the resistance of the silicide is generally always higher in NMOS devices than in PMOS devices, it was surprisingly found that the PMOS device of Example 2 (fabricated using the process of the present invention) has a greater surface resistance than the comparable NMOS device of Example 1. Although not intending to be bound by any particular theory, it is assumed that this result is due to the fact that indium combines very easily with arsenic. This prevents the arsenic from penetrating into the titanium and thus avoids the formation of compounds between titanium and arsenic that reduce the formation of TiSi$_2$ in conventional processes. In contrast, indium does not form compounds with boron and consequently does not alter the effect on silicide formation of the penetration of boron into the titanium.

Figure 5:
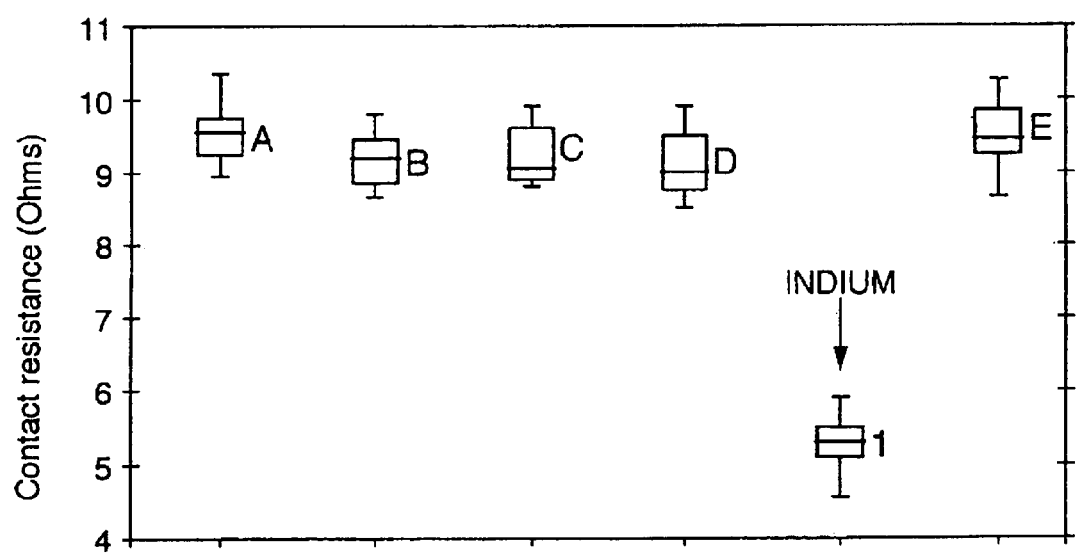
FIGS. 5 and 6 are graphs comparing the contact resistance of NMOS and PMOS devices according to embodiments of the present invention with conventional devices that have undergone arsenic implantation.
Figure 6:
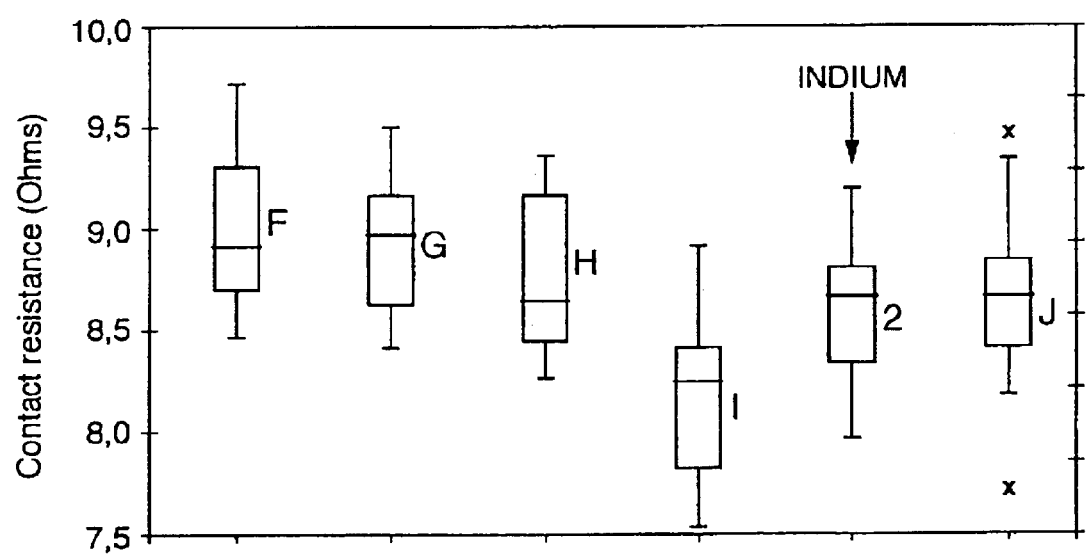

The graphs of FIGS. 5 and 6 show the results of measurements of the contact resistances of the devices of Examples 1 and 2 and the devices of Comparative Examples A through J. With respect to the PMOS devices, it is shown that the contact resistance of the device of Example 2 is comparable to the contact resistance of a standard device and slightly greater than the contact resistance of the best arsenic-implanted device. On the other hand, with respect to the NMOS devices, the device of Example 1 (fabricated using the process of the present invention) exhibits a much lower contact resistance than the devices of the Comparative Examples (i.e., the standard device of Comparative Example E and the arsenic-implanted devices of Comparative Examples A through D).

EXAMPLE 3 AND COMPARATIVE EXAMPLE K

The device of Example 3 was fabricated using the process of the present invention and the device of Comparative Example K was fabricated using a conventional no-implantation process, as described above. However, both the process used to fabricate the device of Example 3 and the process used to fabricate the device of Comparative Example K included a doping of the polysilicon through the implantation of phosphorus atoms at a dose of $4\times10^{15}$ atoms/cm$^2$ at 25 keV.

Figure 7:
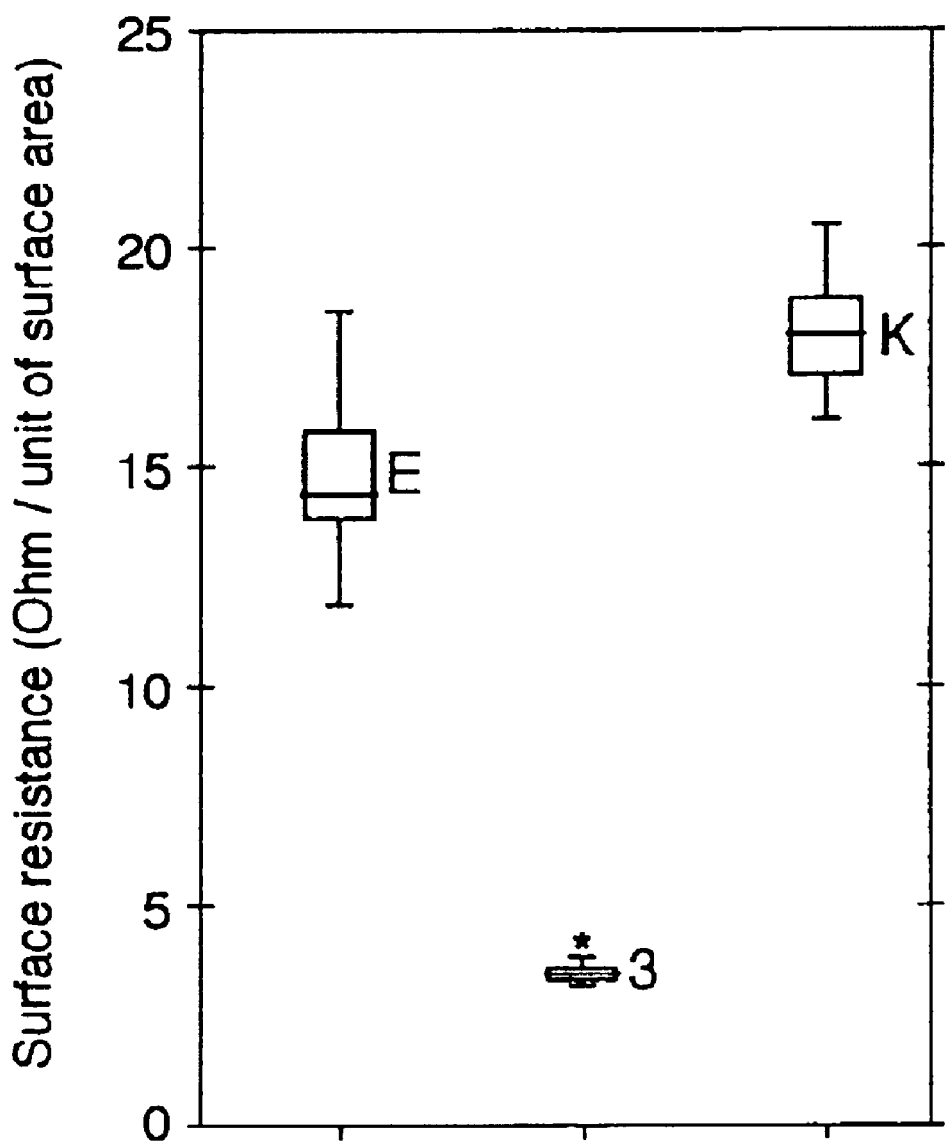
FIG. 7 is a graph comparing the surface resistance of an NMOS device doped to a level of $4\times10^{15}$ atoms of phosphorus/$cm^2$ fabricated using the process of the present invention with an identical NMOS device fabricated using a conventional process.

FIG. 7 shows the measured surface resistances for these NMOS devices. As shown, the predoped device of Comparative Example K that was fabricated using the conventional process has a higher surface resistance than the standard device of Comparative Example E (FIG. 2) that was fabricated using the conventional process without the additional phosphorus doping. On the other hand, the NMOS device of Example 3 fabricated using the process of the present invention with the additional phosphorus doping has a surface resistance that is even more markedly lower than the device Comparative Example E.

EXAMPLE 4

Figure 8:
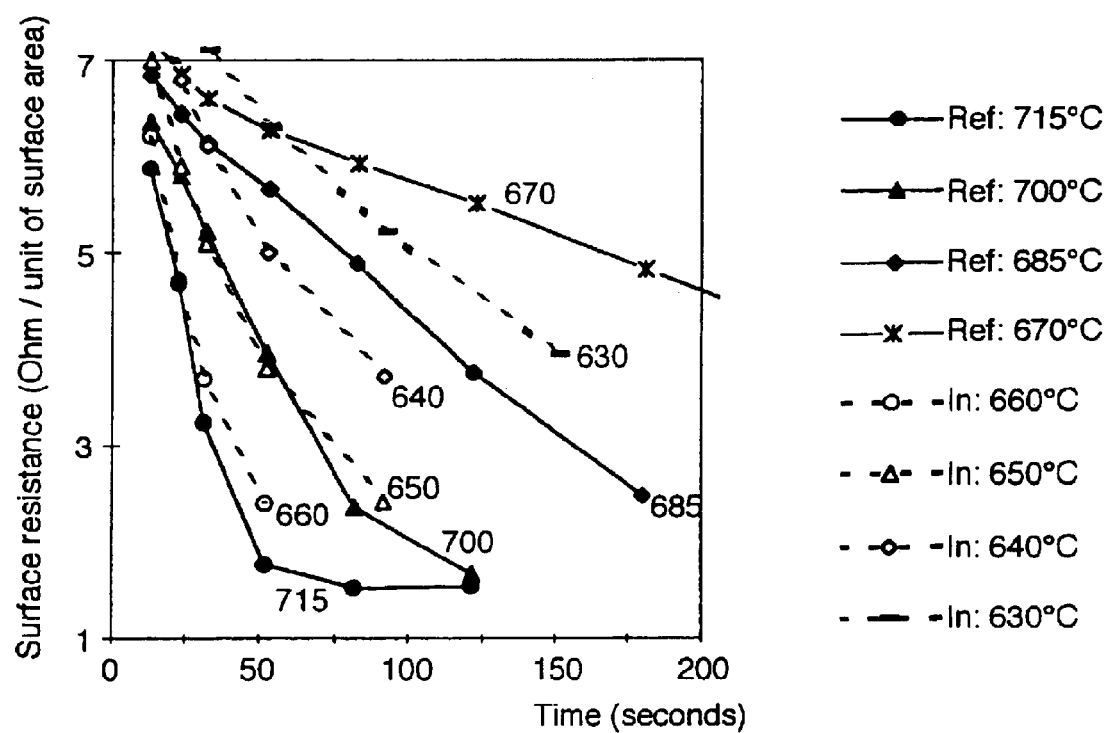
FIG. 8 is a graph showing the effect of the annealing temperature for titanium silicide formation on the surface resistance in the process of the present invention and in a conventional process.

A 40 nm titanium layer and a 25 nm titanium nitride layer were deposited on monocrystalline silicon wafers. Before the deposition, some of the wafers "In" underwent indium implantation in accordance with the present invention at an implantation energy of 25 keV and at an implantation level of $10^{14}$ atoms/cm$^2$, and other wafers "Ref" were not subjected to indium implantation. The resulting wafers were subjected to a rapid thermal annealing operation at various temperatures, and the surface resistances of the titanium silicides that were produced was measured. As shown in FIG. 8, when the indium implantation process of the present invention was used, silicide formation took place at temperatures that were approximately 50° C. below those required to obtain the same surface resistance when the wafer was not subjected to indium implantation.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A method for forming a low resistivity titanium silicide layer on a surface of at least one previously doped region of a silicon semiconductor substrate, said method comprising the steps of:

depositing a titanium layer on the surface of the doped region of the silicon semiconductor substrate, the doped region having been previously doped to form an n-type or p-type source or drain region;

performing a rapid thermal annealing of the silicon semiconductor substrate coated with the titanium layer in order to form titanium silicide; and before the step of performing the rapid thermal annealing, introducing an effective amount of a metallic element at least at the interface between the titanium layer and the doped region of the silicon semiconductor substrate, the metallic element being chosen from the group consisting of indium, gallium, tin, and lead, wherein the rapid thermal annealing step anneals the titanium layer with the introduced metallic element so that the introduced metallic element promotes titanium silicide transformation from C49 phase to C54 phase during the rapid thermal annealing.

2. The method as defined in claim 1, wherein the metallic element is chosen from the group consisting of indium and gallium.

3. The method as defined in claim 1, wherein the metallic element is indium.

4. The method as defined in claim 1, wherein the effective amount of the metallic element is $1 \times 10^{-}$ to $5 \times 10^{14}$ atoms/cm$^2$.

5. The method as defined in claim 1, wherein the effective amount of the metallic element is $5 \times 10^{13}$ to $5 \times 10^{14}$ atoms/cm$^2$.

6. The method as defined in claim 1, wherein the effective amount of the metallic element is $5 \times 10^{13}$ to $3 \times 10^{14}$ atoms/cm$^2$.

7. The method as defined in claim 1, wherein the introducing step includes the sub-step of depositing the effective amount of the metallic element on the surface of the doped region of the silicon semiconductor substrate.

8. The method as defined in claim 1, wherein the introducing step includes the sub-step of implanting the effective amount of the metallic element into the doped region of the silicon semiconductor substrate.

9. The method as defined in claim 8,
wherein the implanting sub-step is performed before the depositing step, and
the implanted metallic element is not thermally annealed before the depositing step.

10. The method as defined in claim 8, wherein in the implanting sub-step, the metallic element is implanted into the silicon semiconductor substrate to a depth of 5 to 25 nm.

11. The method as defined in claim 8, wherein in the implanting sub-step, the metallic element is implanted into the silicon semiconductor substrate to a depth of 8 to 20 nm.

12. The method as defined in claim 8, wherein in the implanting sub-step, the implantation energy is 5 to 30 keV.

13. The method as defined in claim 8, wherein in the implanting sub-step, the implantation energy is approximately 25 keV.

14. The method as defined in claim 8,
wherein the implanting sub-step is performed after the depositing step, and
the deposited titanium layer is not thermally annealed before the implanting sub-step.

15. The method as defined in claim 1,
wherein the introducing step is performed before the depositing step, and
the introduced metallic element is not thermally annealed before the depositing step.

16. The method as defined in claim 1, wherein the doped region is an n-type region.

17. The method as defined in claim 1, wherein the doped region is doped with arsenic.

18. The method as defined in claim 1, wherein the metallic element is chosen from the group consisting of gallium, tin, and lead.

19. A method for fabricating a semiconductor device, said method comprising the steps of:

doping at least one region of a silicon semiconductor substrate with a first metallic element to form an n-type or n-type source or drain region; and after the doping step, forming a low resistivity titanium silicide layer on the surface of the at least one doped region of the silicon semiconductor substrate, the forming step including the sub-steps of:

depositing a titanium layer on the surface of the at least one doped region of the silicon semiconductor substrate;

performing a rapid thermal annealing of the silicon semiconductor substrate coated with the titanium layer in order to form titanium silicide; and before the sub-step of performing the rapid thermal annealing, introducing an effective amount of a second metallic element at least at the interface between the titanium layer and the at least one doped region of the silicon semiconductor substrate, the second metallic element being chosen from the group consisting of indium, gallium, tin, and lead, wherein the rapid thermal annealing sub-step anneals the titanium layer with the second metallic element so that the second metallic element promotes titanium silicide transformation from C49 phase to C54 phase during the rapid thermal annealing.

20. The method as defined in claim 19, wherein the second metallic element is chosen from the group consisting of indium and gallium.

21. The method as defined in claim 19, wherein the effective amount of the second metallic element is $1 \times 10^{13}$ to $5 \times 10^{14}$ atoms/cm$^2$.

22. The method as defined in claim 19, wherein the introducing sub-step includes depositing the effective amount of the second metallic element on the surface of the at least one doped region of the silicon semiconductor substrate.

23. The method as defined in claim 19, wherein the introducing sub-step includes implanting the effective amount of the second metallic element into the at least one doped region of the silicon semiconductor substrate.

24. The method as defined in claim 23,
wherein the implanting of the introducing sub-step is performed after the depositing sub-step, and
the deposited titanium layer is not thermally annealed before the introducing sub-step.

25. The method as defined in claim 23,
wherein the implanting of the introducing sub-step is performed before the depositing sub-step, and
the second metallic element is not thermally annealed before the depositing sub-step.

26. The method as defined in claim 23, wherein in the implanting of the introducing sub-step, the second metallic element is implanted into the silicon semiconductor substrate to a depth of 5 to 25 nm.

27. The method as defined in claim 23, wherein in the implanting of the introducing sub-step, the implantation energy is 5 to 30 keV.

28. The method as defined in claim 19, wherein the at least one doped region includes at least one n-type source or drain region.

29. The method as defined in claim 19, wherein the at least one doped region includes at least one region doped with arsenic.

30. The method as defined in claim 19, wherein the second metallic element that promotes titanium silicide transformation from C49 phase to C54 phase during the rapid thermal annealing is different than the first metallic element used in the doping step to form the n-type or p-type source or drain region.

31. A method for forming a low resistivity titanium silicide layer on a surface of a silicon semiconductor substrate, said method comprising the steps of:

depositing a titanium layer on the surface of the silicon semiconductor substrate;

introducing an effective amount of a metallic element at least at the interface between the titanium layer and the silicon semiconductor substrate, the metallic element being chosen from the group consisting of indium, gallium, tin, and lead; and after the depositing and introducing steps, performing a single rapid thermal annealing of the silicon semiconductor substrate coated with the deposited titanium layer so as to form C54 phase titanium silicide from the deposited titanium layer, wherein the single rapid thermal annealing anneals the titanium layer with the introduced metallic element so that the introduced metallic element promotes titanium silicide transformation from C49 phase to C54 phase during the single rapid thermal annealing.

* * * * *